United States Patent
Park

(10) Patent No.: US 7,732,871 B2
(45) Date of Patent: Jun. 8, 2010

(54) MOS TRANSISTOR AND MANUFACTURING METHOD THEREOF

(75) Inventor: Hyuk Park, Ansan-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/476,633

(22) Filed: Jun. 2, 2009

(65) Prior Publication Data
US 2009/0236674 A1    Sep. 24, 2009

Related U.S. Application Data

(62) Division of application No. 11/526,934, filed on Sep. 25, 2006, now Pat. No. 7,556,954.

(30) Foreign Application Priority Data
Sep. 23, 2005    (KR) .................. 10-2005-0088661

(51) Int. Cl.
*H01L 29/76* (2006.01)
(52) U.S. Cl. .................. 257/382; 257/E21.619; 257/E21.634; 438/197
(58) Field of Classification Search .............. 257/382, 257/E21.619, E21.634; 438/197
See application file for complete search history.

(56) References Cited

U.S. PATENT DOCUMENTS

| 2004/0041179 A1 | 3/2004 | Mizushima et al. |
| 2005/0079691 A1 | 4/2005 | Kim et al. |
| 2005/0079692 A1 | 4/2005 | Samoilov et al. |
| 2007/0138482 A1* | 6/2007 | Tanimoto ................. 257/77 |

* cited by examiner

*Primary Examiner*—Thanh V Pham
(74) *Attorney, Agent, or Firm*—The Law Offices of Andrew D. Fortney; Andrew D. Fortney

(57) ABSTRACT

Disclosed are a MOS transistor having a low resistance ohmic contact characteristic and a manufacturing method thereof capable of improving a drive current of the MOS transistor. A gate oxide layer, a gate electrode, and a spacer are formed on a silicon substrate, and a silicon carbide layer is deposited thereon. A photolithography process is performed, and the silicon carbide layer is etched except for predetermined portions corresponding to source-drain regions and the gate electrode. Then, a metal layer is formed on the resulting structure after performing a source-drain ion implantation process. The metal layer is heated to form a salicide layer on the gate electrode and the source-drain diffusion regions. Then, the unreacted metal layer is removed, thereby forming the MOS transistor.

11 Claims, 3 Drawing Sheets

_US 7,732,871 B2_

MOS TRANSISTOR AND MANUFACTURING METHOD THEREOF

This application is a divisional of U.S. patent application Ser. No. 11/526,934, filed on Sep. 25, 2006 now U.S. Pat. No. 7,556,954, which claims the benefit of Korean Application No. 10-2005-0088661, filed on Sep. 23, 2005, each of which is incorporated by reference herein in its entirety.

BACKGROUND OF THE INVENTION

1. Field of the Invention

The present invention relates to a MOS transistor and a manufacturing method thereof, and more specifically, to a MOS transistor and a manufacturing method thereof, in which a modified silicon channel is formed using silicon carbide, thereby improving a drive current of the MOS transistor, and in which a nickel salicide layer may be formed using silicon carbide so that the MOS transistor has low resistance contact characteristics.

2. Background of the Related Art

With the rapid development of high-speed and high-integration semiconductor devices, micro-sized transistors have been realized. As the semiconductor devices have become highly integrated, a drive current of the semiconductor device may be reduced, so that the performance of the semiconductor device may be degraded. In order to solve this problem, various methods have been suggested. One of them is a method of improving mobility of carriers by applying the stress to silicon.

Conventionally, a strained silicon (strained-Si) epitaxial layer is formed by using a silicon germanium (SiGe) epitaxial layer in order to apply the stress to silicon. However, such a silicon epitaxial layer may cause lattice damage to silicon, thereby increasing leakage current of the MOS transistor.

Another conventional method is to induce a vertically isotropic tension stress by depositing a nitride layer on a gate and a spacer after forming a strained-Si epitaxial layer using a SiGe epitaxial layer. However, this method may increase the manufacturing cost due to the addition of a nitride layer depositing process.

Meanwhile, a contact for a metal wiring must be formed after a gate electrode and a source-drain active region of a semiconductor device have been formed, in order to electrically connect the gate electrode and the source-drain active region to external devices. However, surface resistance of the thin polycrystalline silicon gate and the source-drain active region, which are prepared corresponding to the scale-down of the semiconductor device, generally are not reduced to a level below a range between 10 to 20 ohms/square. For this reason, utility of the thin polycrystalline silicon gate and the source-drain active region, which serve as interconnection media, may be significantly reduced.

In order to solve the above problem by improving the interconnection characteristics of the thin polycrystalline silicon gate and the source-drain active region, a salicide layer having a low specific resistance is formed on the gate and silicon of the source-drain active region. In this case, parasitic capacitance derived from overlap of the source-drain and the gate can be reduced and a contact area between a metal wiring and the source-drain may increase, so that the contact resistance and internal resistance of the source-drain can be reduced.

Among conventional salicide forming processes, a nickel salicide process forms a nickel salicide (e.g., $Ni_2Si$) layer by reacting silicon of the source-drain region with nickel. However, the nickel salicide layer obtained through the above nickel salicide process is generally thermally unstable at a temperature of 500° C. or above, which corresponds to the temperature of a chemical vapor deposition process for forming a subsequent (e.g., inter-metal) layer, which may cause contact leakage current. To solve this problem, there has been suggested a method of implanting nitrogen (N) or Ni—Pt ions into nickel. However, this method introduces an additional manufacturing cost.

SUMMARY OF THE INVENTION

It is, therefore, an object of the present invention to provide a method for forming a MOS transistor having an improved drive current by forming a modified silicon channel using silicon carbide.

Another object of the present invention is to provide a method of forming a MOS transistor, in which a nickel salicide layer is formed using silicon carbide so that the MOS transistor has low resistance contact characteristics.

Still another object of the present invention is to provide a MOS transistor capable of having low resistance contact characteristics while improving a drive current thereof by forming a modified silicon channel and a nickel salicide layer, using silicon carbide.

According to a preferred embodiment of the present invention, there is provided a method of manufacturing a MOS transistor, the method comprising the steps of forming a gate oxide layer, a gate electrode, and a spacer on a silicon substrate; forming a silicon carbide layer on an entire surface of the silicon substrate and the gate electrode; removing the silicon carbide layer except for predetermined portions of the silicon carbide layer corresponding to source-drain regions of the substrate and the gate electrode; implanting dopants into the source-drain regions, thereby forming source-drain diffusion regions; forming a metal layer on the entire surface of the silicon substrate; performing a heat-treatment process, thereby forming a salicide layer on the gate electrode and the source-drain diffusion regions; and removing the remaining metal layer (i.e., except for predetermined portions of the metal layer which form the salicide layer). Preferably, a low-density ion implantation is performed with respect to (or in) the source-drain regions before the spacer is formed, thereby forming a lightly doped drain. The silicon substrate located between the source-drain diffusion regions is advantageously modified by means of the silicon carbide layer on the source-drain regions (and which may remain in the MOS transistor).

According to a preferred embodiment of the present invention, there is provided a MOS transistor comprising a silicon substrate; a gate oxide layer on the silicon substrate having a predetermined width; a gate electrode on the gate oxide layer; spacers on sidewalls of the gate electrode; source-drain diffusion regions (which are preferably formed by implanting dopants into the silicon substrate) on opposite sides of the gate electrode; a silicon carbide and/or carbon layer on the source-drain diffusion regions and the gate electrode; and a salicide layer on the silicon carbide and/or carbon layer. Preferably, the silicon carbide layer above the source-drain diffusion regions applies a horizontal tension stress and a vertical compression stress to the silicon substrate so that the silicon substrate located between the source-drain diffusion regions is modified. The salicide layer may comprise nickel salicide. The silicon carbide and/or carbon layer may comprise both silicon carbide and carbon, and the carbon (e.g., graphite) layer may be between the silicon carbide layer and the (nickel) salicide layer.

DETAILED DESCRIPTION OF THE PREFERRED EMBODIMENT

Figure 1:
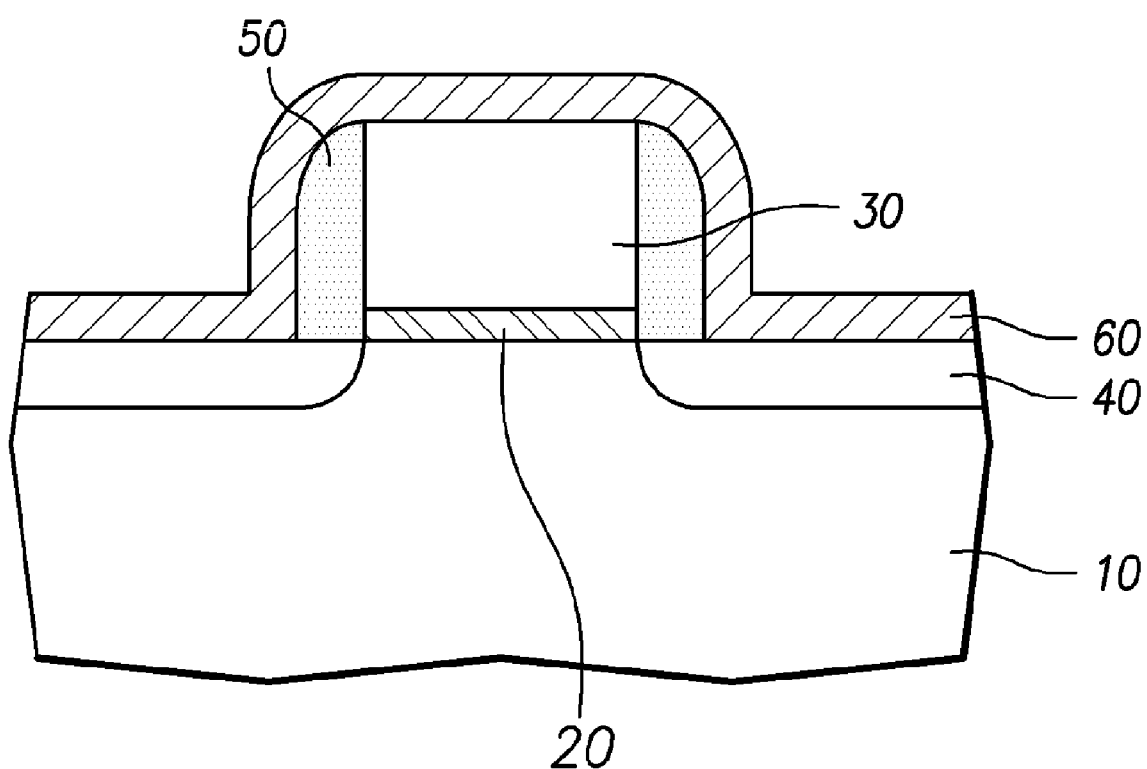
FIGS. 1 to 3 are views illustrating a method of manufacturing a MOS transistor according to the preferred embodiment of the present invention.

Hereinafter, a preferred embodiment according to the present invention will be described in detail, with reference to the following drawings.

In the following description of the present invention, technologies which are generally known in the art and do not directly relate to the present invention will be omitted in order to avoid redundancy and to clarify the subject manner of the present invention. In the same manner, some of elements are exaggerated, omitted or simplified in the drawings and the elements may have sizes different from those shown in drawings, in practice.

Figure 2:
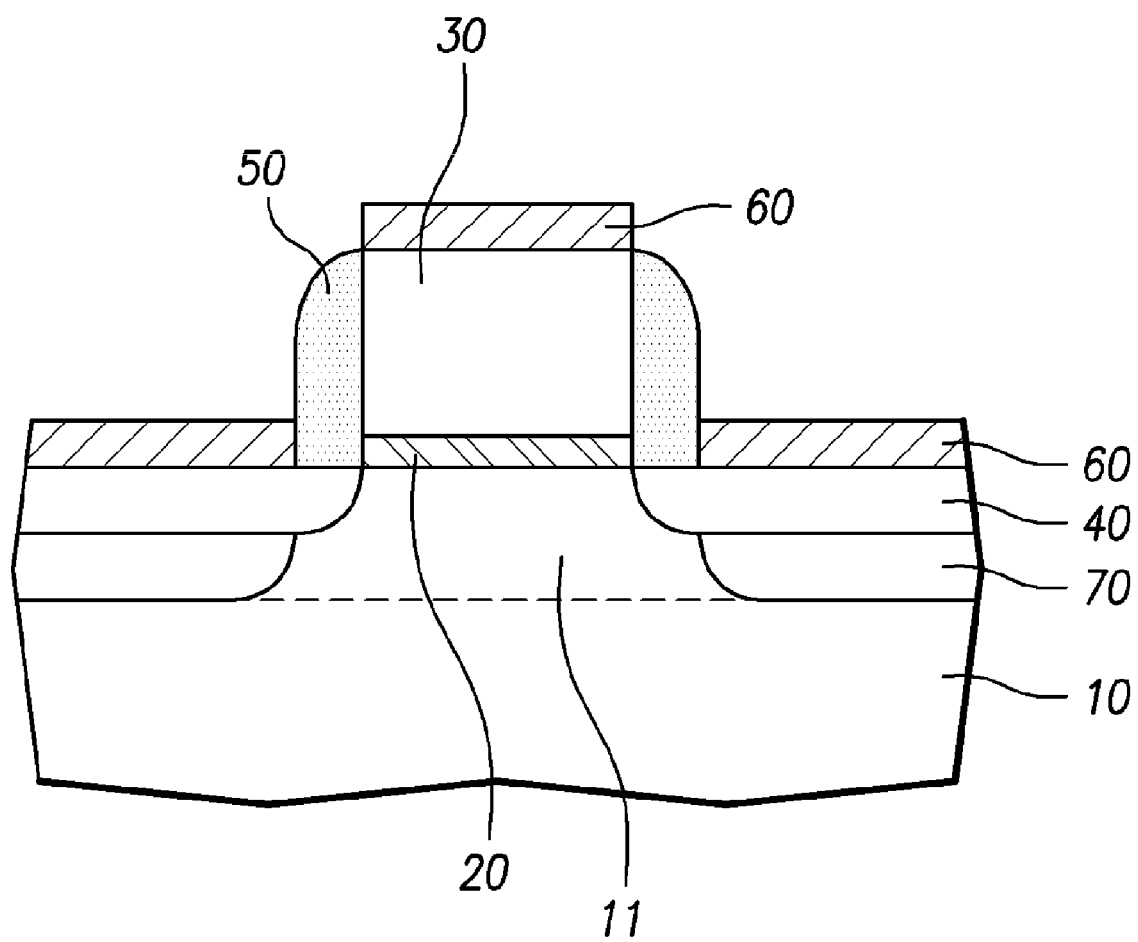
Figure 3:
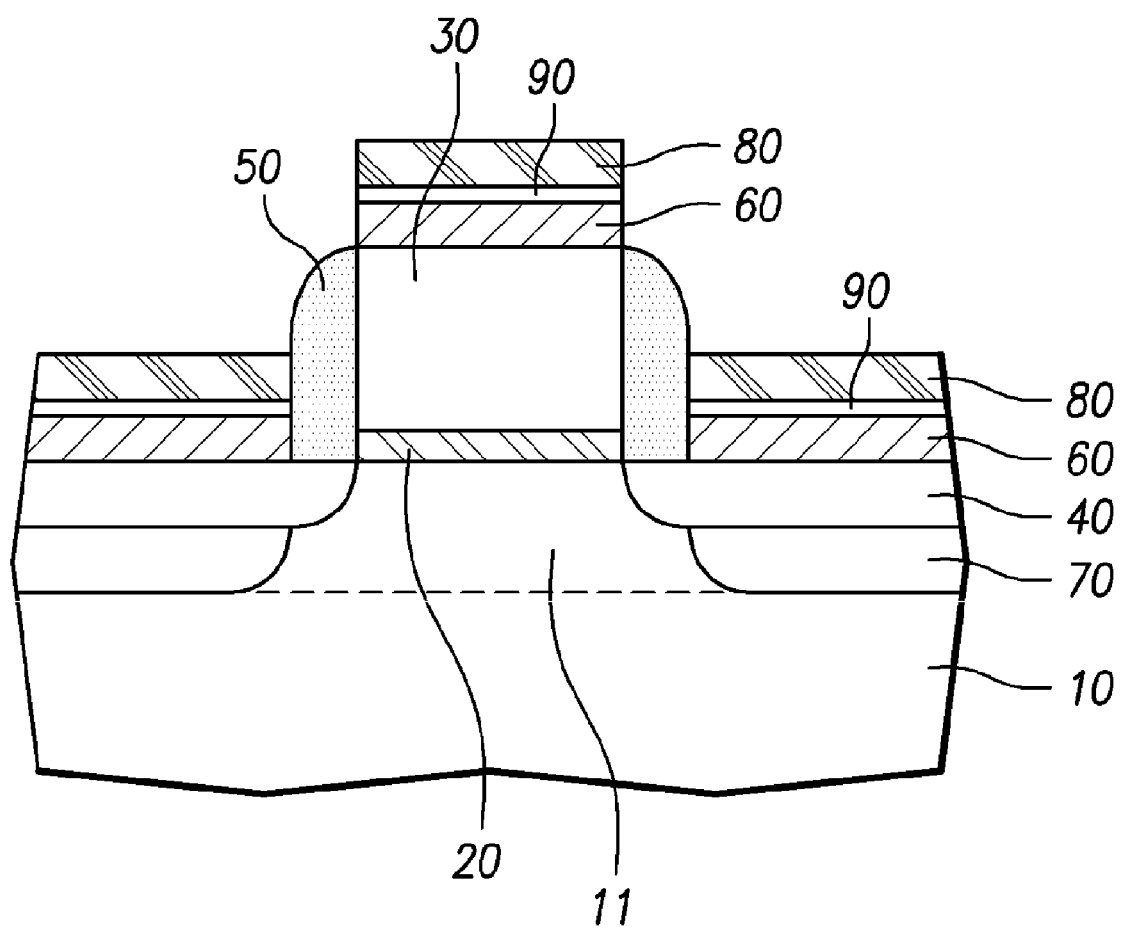

FIGS. 1 to 3 are views illustrating a method of manufacturing a MOS transistor according to the preferred embodiment of the present invention.

First, prior to forming silicon carbide on a semiconductor device according to the present invention, a gate oxide layer 20, a gate 30, a lightly doped drain (LDD) 40 and a spacer 50 are formed on a silicon substrate 10 as shown in FIG. 1.

Then, a silicon carbide (SiC) layer 60 is deposited on the entire surface of the silicon substrate 10, including the gate 30, the lightly doped drain (LDD) 40 and the spacer 50. The SiC layer 60 may be formed by a plasma enhanced chemical vapor deposition (PECVD) from $SiH_4$ and $CH_4$ gases and at a temperature of 350° C.~450° C., in such a manner that the resulting SiC layer 60 has a thickness of 300 Å~500 Å.

After that, referring to FIG. 2, a normal photolithography process is performed so as to etch the SiC layer 60. At this time, predetermined portions of the SiC layer 60 corresponding to upper portions of the gate 30 and source-drain diffusion regions 70 may not be etched. To etch a silicon carbide layer except for the predetermined portions of the SiC layer 60, a RIE (Reactive Ion Etching) process is performed by using a mask comprising a patterned photo-resist having a thickness of 0.2 μm. In one embodiment, patterning the mask may comprise two successive photolithographic exposure steps; a first step to expose (and/or irradiate) the portion of the photoresist over the gate electrode 30, and a second step to expose (and/or irradiate) the portion of the photoresist over the source-drain diffusion regions 70, or vice versa.

As shown in FIG. 2, the SiC layer 60 formed above the source-drain diffusion region 70 applies a horizontal tension stress and a vertical compression stress to the silicon substrate 10 having a silicon channel 11 formed between the source-drain diffusion regions 70. Here, different from conventional devices, which use a modified silicon epitaxial layer obtained by using a silicon germanium epitaxial layer, the present invention modifies the silicon substrate by forming silicon carbide on the exposed silicon substrate corresponding to the source-drain regions 70 (and on the gate electrode 30) such that the silicon substrate 10 (and preferably the channel 11) has a relatively greater lattice constant.

Then, a source-drain ion implantation process is performed in order to form the source-drain diffusion regions 70. At this time, the mobility of electric charges that move through the silicon substrate 11 between the source-drain diffusion regions 70 (or channel) and modified by the silicon carbide layer 60, is 4000 $cm^2$/v-s higher than that of electric charges that move through an unmodified silicon substrate (i.e., otherwise the same, but without a silicon carbide layer 60 thereon).

Referring to FIG. 3, a metal layer 80 is deposited on the entire surface of the silicon substrate 10, including the silicon carbide layer 60. At this time, the metal layer 80 may be blanket-deposited by physical vapor deposition (PVD) at a temperature of 400° C.~600° C. The metal layer 80 may comprise any metal conventionally used to form a metal salicide, such as nickel, titanium, molybdenum, tungsten, cobalt, platinum, palladium, tantalum, etc., but preferably comprises nickel.

Then, the silicon substrate 10 having the metal layer 80 thereon is subject to a heat-treatment process (e.g., heating in a conventional furnace or oven, such as a rapid thermal processing [RTP] oven) at a temperature of 900° C. or above. Generally, the temperature does not exceed 1200° C. During the heat-treatment process, the metal (e.g., nickel) layer reacts with the silicon carbide layer 60, thereby forming a metal salicide layer (e.g., nickel salicide or $Ni_2Si$ layer[s]) 80 on upper portions of the silicon substrate 10, which correspond to the upper end(s) or upper surface(s) of the gate 30 and the source-drain diffusion regions 70. At this time, a carbon (e.g., graphite) layer 90 is formed on the silicon carbide layer 60 as a by-product. Accordingly, the silicon substrate 10 may have a structure including the metal (nickel) salicide layer 80, the carbon (graphite) layer 90 and the silicon carbide layer 60, representing an ohmic contact the having low resistance characteristics. Alternatively, the silicon of the silicon carbide layer 60 may be substantially completely consumed in the process of forming the metal salicide layer, in which case the structure of the contact includes the metal salicide layer 80 and the carbon layer 90 on the source-drain diffusion regions 70. Preferably, however, the contact has the structure shown in FIG. 3, to maintain a stress or other force on the substrate 10 and/or channel 11 that is beneficial and/or optimal for improving carrier mobility.

After that, the remaining metal (nickel) layer which does not react with the silicon carbide layer 60 is removed through a selective etching process. The structure including the metal (nickel) salicide layer 80, the carbon (graphite) layer 90 and the silicon carbide layer 60 may realize a MOS transistor having superior low resistance contact characteristics as compared with a MOS transistor having a conventional salicide structure.

The method of manufacturing the MOS transistor according to the present invention can improve the drive current of the MOS transistor by using the silicon carbide layer without using a conventional silicon germanium epitaxial layer. That is, according to the present invention, horizontal tension stress and vertical compression stress are applied to the silicon substrate by the silicon carbide layer, so that the silicon substrate between the source-drain diffusion regions (i.e., the transistor channel) is modified (e.g., has a modified lattice constant), thereby improving the drive current of the MOS transistor.

In addition, the metal (nickel) salicide layer can be formed on the silicon carbide layer without performing an additional process, so that it is possible to fabricate the semiconductor device having the structure including a metal (nickel) salicide layer, a carbon (graphite) layer and the silicon carbide layer, which can have desirable low resistance ohmic contact characteristics.

Furthermore, the present invention can improve the drive current of the MOS transistor and can provide a semiconductor device having a structure with low resistance ohmic contact characteristics using silicon carbide.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A MOS transistor comprising:
    a silicon substrate;
    a gate oxide layer on the silicon substrate having a predetermined width;
    a gate electrode on the gate oxide layer;
    spacers on sidewalls of the gate electrode;
    source-drain diffusion regions in the silicon substrate and opposite sides of the gate electrode;
    a silicon carbide and a graphite layer on an upper portion of the source-drain diffusion regions and an upper portion of the gate electrode; and
    a nickel layer on the silicon carbide and the graphite layer.

2. The MOS transistor of claim 1, comprising the silicon carbide layer, which applies a horizontal tension stress and a vertical compression stress to the silicon substrate.

3. The MOS transistor of claim 1, wherein the silicon substrate between the source-drain diffusion regions has a modified lattice constant.

4. The MOS transistor of claim 1, comprising the silicon carbide layer and the graphite layer, where the graphite layer is between the silicon carbide layer and the salicide layer.

5. The MOS transistor of claim 1, wherein the graphite layer is on the silicon carbide layer and the nickel salicide layer is on the graphite layer.

6. The MOS transistor of claim 1, wherein the silicon carbide layer on the source-drain regions modifies the silicon substrate between the source-drain diffusion regions.

7. The MOS transistor of claim 6, wherein the silicon carbide layer on the source-drain regions modifies a lattice constant of the silicon substrate between the source-drain diffusion regions.

8. The MOS transistor of claim 6, wherein the silicon carbide layer on the source-drain regions applies a horizontal tension stress and a vertical compression stress to the silicon substrate.

9. The MOS transistor of claim 1, wherein the silicon carbide layer has a thickness of 300 Å to 500 Å.

10. The MOS transistor of claim 1, further comprising lightly doped drain regions in the silicon substrate on opposite sides of the gate electrode.

11. The MOS transistor of claim 1, wherein the salicide layer comprises nickel salicide, titanium salicide, molybdenum salicide, tungsten salicide, cobalt salicide, platinum salicide, palladium salicide, or tantalum salicide.

* * * * *